US006780698B2

United States Patent
Suwa et al.

(10) Patent No.: US 6,780,698 B2
(45) Date of Patent: Aug. 24, 2004

(54) SEMICONDUCTOR DEVICE AND ITS PRODUCTION METHOD

(75) Inventors: Yuji Suwa, Kokubunji (JP); Tomihiro Hashizume, Hatoyama (JP); Ken Yamaguchi, Fuchu (JP); Masaaki Fujimori, Hatoyama (JP)

(73) Assignee: Hitachi, Ltd., Tokyo (JP)

( * ) Notice: Subject to any disclaimer, the term of this patent is extended or adjusted under 35 U.S.C. 154(b) by 22 days.

(21) Appl. No.: 10/194,253

(22) Filed: Jul. 15, 2002

(65) Prior Publication Data

US 2003/0119247 A1 Jun. 26, 2003

(30) Foreign Application Priority Data

Dec. 26, 2001 (JP) ........................................ 2001-393451

(51) Int. Cl.$^7$ .......................................... H01L 21/8238
(52) U.S. Cl. ........................ 438/217; 438/276; 438/289; 438/291
(58) Field of Search ................................ 438/197, 217, 438/276, 282, 289, 290, 291

(56) References Cited

U.S. PATENT DOCUMENTS 5,118,632 A * 6/1992 Schrantz .................... 438/194

FOREIGN PATENT DOCUMENTS

| JP | 53-095571 | 8/1978 |
| JP | 61-116875 | 6/1986 |
| JP | 06-283432 | 10/1994 |

OTHER PUBLICATIONS

"Observation of dopant–atom dimmers on hydrogen–terminated Si(100)–2×1 surface by scanning tunneling microscopy," S. Matsuura et al., Proc. 25$^{th}$ Int. Conf. Phys.Semicond., Osaka 2000, pp. 437–438.

"Kinetics of the generation of atomic hydrogen and its adsorption on Si(110)," T. Sakurai et al., T. Sakurai et al., J. Vac. Sci. Technol., vol. 14, No. 1, Jan./Feb. 1997, pp. 397–399.

* cited by examiner

Primary Examiner—Phat X. Cao
Assistant Examiner—Theresa T. Doan
(74) Attorney, Agent, or Firm—Antonelli, Terry, Stout & Kraus, LLP

(57) ABSTRACT

A method for producing a semiconductor device which comprises causing a dopant present in a semiconductor substrate to segregate in the surface of said semiconductor substrate, thereby forming a thin layer which has a higher dopant concentration than said substrate. The thin layer formed by segregation prevents punch-through which occurs as the result of miniaturization of MOSFET. This method permits economical delta doping without sacrificing the device characteristics.

10 Claims, 10 Drawing Sheets

DENSITY OF DOPANTS

SEMICONDUCTOR DEVICE AND ITS PRODUCTION METHOD

BACKGROUND OF THE INVENTION

1. Field of the Invention

The present invention relates to a semiconductor device and a method for production thereof. More particularly, the present invention relates to a technology to permit miniaturization of semiconductor integrated circuits by providing the substrate with a dopant-rich thin layer buried therein.

2. Description of the Related Art

Silicon integrated circuits owe their high integration level and high speed to miniaturization of fabrication dimensions. However, in the case of MOSFET (metal oxide semiconductor field effect transistor), miniaturization poses a problem with punch-through, which is a phenomenon that current flows from the drain to the source due to a short circuit between them. One way to address this problem was by increasing doping concentration of the region between the source and the drain whose doping type is opposite to that of the source and the drain. This conventional approach, however, is not satisfactory when miniaturization progresses to such an extent that the gate is shorter than 0.1 $\mu$m. In this state, doping increases the capacity of the source and drain too much, thereby sacrificing device characteristics.

An ideal method for preventing punch-through, without sacrificing device characteristics, is disclosed in Japanese Patent Laid-open Nos. 95571/1978 and 116775/1986. This method consists in forming a delta doping layer (as thin as several atomic layers with a high dopant concentration) in the position where short-circuiting is liable to occur. The delta doping layer may be formed by causing a doping impurity to be adsorbed to the surface as disclosed in Japanese Patent Laid-open No. 283432/1994. This method, however, is not used for production of MOSFET because it presents difficulties in controlling the amount of adsorption, it needs complex procedure to specify the position of adsorption, and it requires complex equipment which leads to a high production cost.

OBJECT AND SUMMARY OF THE INVENTION

It is an object of the present invention to provide a method for forming a delta doping layer which prevents punch-through hindering miniaturization of MOSFET without sacrificing the device characteristics in an accurate, stable and inexpensive manner.

According to the present invention, prevention of punch-through is accomplished by introducing dopant atoms into the semiconductor substrate through ion implantation and subsequently causing the dopant atoms to segregate in the surface, with the resulting surface layer functioning as the delta doping layer. Ion implantation offers a technical advantage of permitting one to accurately specify the doping position and accurately control the doping amount. It also offers an economical advantage of requiring no additional investment in production facilities. Incidentally, the term "segregation" denotes a phenomenon that impurity atoms distribute themselves in the semiconductor substrate such that their concentration is higher in the surface than in the inside.

It is a well-known fact that heavily doped impurity atoms separate out (or segregate) in the surface of semiconductor. Such segregation has been regarded as undesirable from the standpoint of keeping the doping amount as high as possible. Contrary to this prevailing idea, the present invention makes the best use of surface segregation.

Other and further objects, features and advantages of the invention will appear more fully from the following description.

DESCRIPTION OF THE PREFERRED EMBODIMENTS

Figure 1:
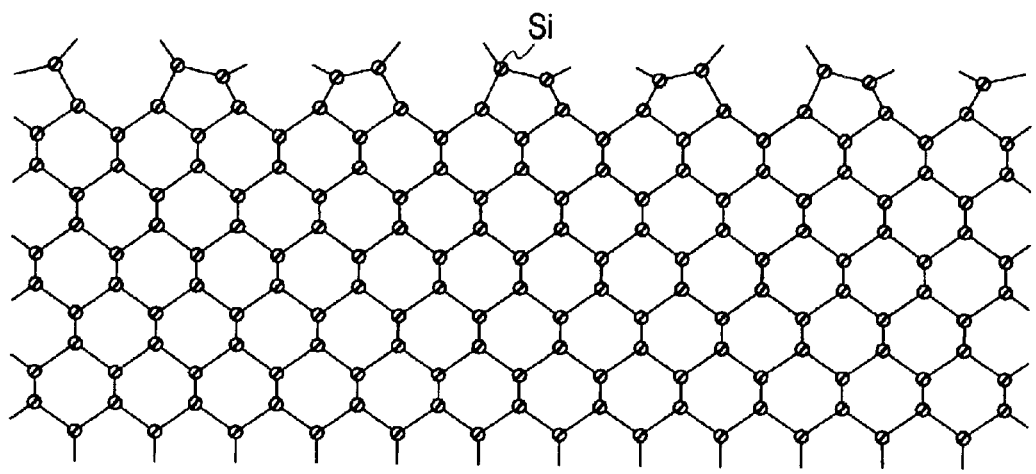
FIG. 1 is a schematic diagram showing an example of the arrangement of atoms in the silicon substrate which can be used in the present invention.

The present invention needs adequate control over the condition that permits surface segregation and the amount of segregation. This object is achieved by hydrogen termination of silicon surface. It is known that hydrogen termination brings about surface segregation even in the case where the impurity concentration is low enough for surface segregation not to occur in a clean surface, as reported in Proc. 25$^{th}$ Int. Conf. Phys. Semicond., Osaka 2000, p. 437. In fact, observation under a scanning tunneling microscope (STM) revealed that the hydrogen-terminated silicon surface is abound with impurity atoms (phosphorus atoms in this case). The result of observation agrees with the result of computer simulation based on quantum mechanics, which indicates that phosphorus atoms have lower energy and are stabler at the surface of silicon (after segregation) than in the inside of silicon. This may be reasoned as follows. A clean surface of silicon without hydrogen termination has a top layer in which silicon atoms are arranged in a zigzag, and phosphorus atoms segregating near the surface distort further the zigzag arrangement of silicon atoms, thereby increasing the total energy. By contrast, a hydrogen-terminated surface has a top layer in which silicon atoms are arranged regularly without distortion as a result of the formation of bonding between hydrogen atoms and silicon atoms in the top layer. Hence, segregation of phosphorus atoms does not appreciably increase the total energy. This reasoning suggests that terminating hydrogen may be replaced by any other element which binds only with silicon in the top layer. Such an element includes those of Group I (such as Li, Na, K, Rb, and Cs) and Group VII (such as F, Cl, Br, and I). The foregoing idea is applicable to not only silicon semiconductor but also gallium arsenide and other semiconductors, which permit surface segregation of phosphorus atoms.

The advantage of hydrogen termination is that the hydrogen-terminated surface permits, after formation of a delta doping layer, silicon atoms to be adsorbed just below hydrogen atoms. Thus, silicon crystals can be grown at a lower temperature in this case than in the case where hydrogen termination is not employed (ca. 200° C. versus ca. 800° C.). The treatment at a low temperature permits the local distribution of dopant to remain sharp in the delta doping layer, in contrast to the treatment at a high temperature which causes dopant (phosphorus atoms) to diffuse from the confined region. For the silicon layer to grow at a low temperature, it is necessary that hydrogen atoms attach themselves to the phosphorus atoms which have segregated and replaced the silicon atoms in the top layer. Otherwise, the silicon atoms deposited on the phosphorus atoms are arranged irregularly. According to the above-mentioned computer simulation, phosphorus atoms are weakly bound with hydrogen atoms in their stable surface structure. Silicon crystals can be grown on this structure at a low temperature.

A mention is made below of the segregation of phosphorus atoms and the deposition of silicon atoms after formation of the delta doping layer, with reference to FIGS. 1 to 4 which are schematic diagrams at the atomic level.

FIG. 1 is a schematic diagram showing an example of the arrangement of atoms in the silicon substrate which can be used in the present invention. Each small circle with an oblique line represents a silicon atom. At the (100) clean surface of the silicon substrate, silicon atoms in the top layer arrange in a zigzag and form a distorted structure, while those in the second and lower layers arrange regularly.

Figure 2:
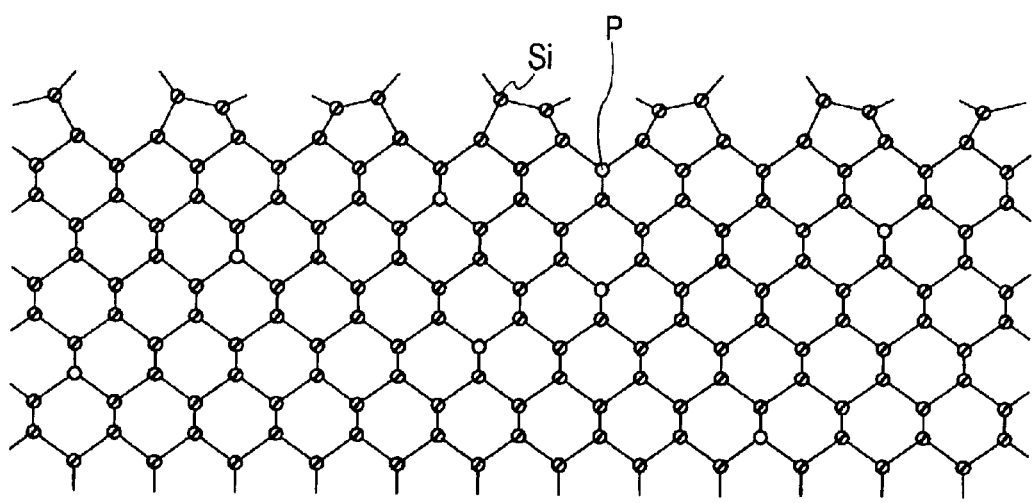
FIG. 2 is a schematic diagram showing an example of the arrangement of atoms in an n-type region (about 0.3 $\mu$m thick) of the silicon substrate with (100) surface doped with phosphorus atoms in a concentration of about $10^{17}/cm^3$. (Doping was carried out by ion implantation.)

FIG. 2 is a schematic diagram showing an example of the arrangement of atoms in an n-type region (about 0.3 μm thick) of the silicon substrate with (100) surface doped with phosphorus atoms in a concentration of about $10^{17}/cm^3$. (Doping was carried out by ion implantation.) Each small open circle represents a phosphorus atom. FIG. 2 represents a very small part of the whole doped region, but the random arrangement of phosphorus atoms can be seen. Doped phosphorus atoms take substitutional positions of silicon atoms in the substrate.

Figure 3:
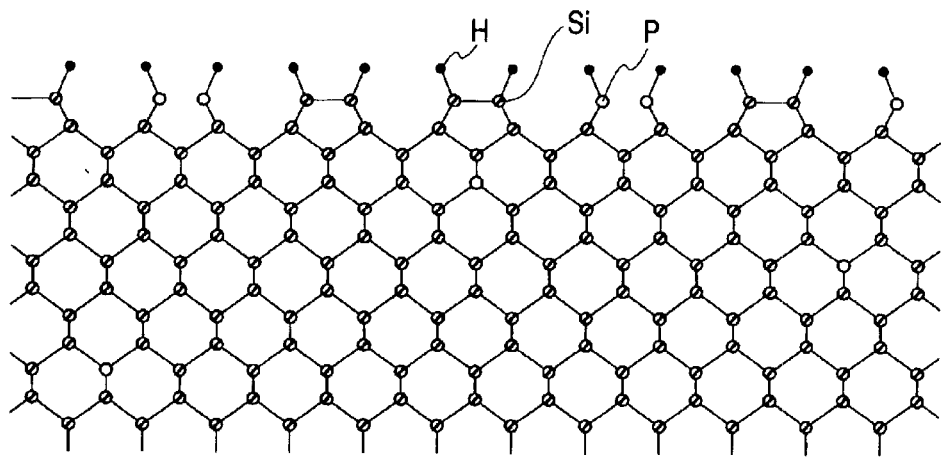
FIG. 3 is a schematic diagram showing how atoms are arranged in the surface of the substrate after the segregation of phosphorus atoms as the result of hydrogen termination on the (100) surface of the silicon substrate.

FIG. 3 is a schematic diagram showing how atoms are arranged in (100) surface of the substrate after the segregation of phosphorus atoms as the result of hydrogen termination. Each black circle at the top represents a hydrogen atom. Scrutiny of the top layer in FIG. 3 reveals that phosphorus atoms segregate in pairs in the (100) surface of the silicon substrate. Hydrogen atoms adequately adsorbed to the top of (100) silicon surface form one monolayer. However, they may form a half monolayer or two monolayers on other crystal plane than the (100) plane or on other surface than silicon surface. It is understood by comparison of FIG. 2 with FIG. 3 that phosphorus atoms migrate randomly in the substrate when hydrogen termination is carried out.

Figure 4:
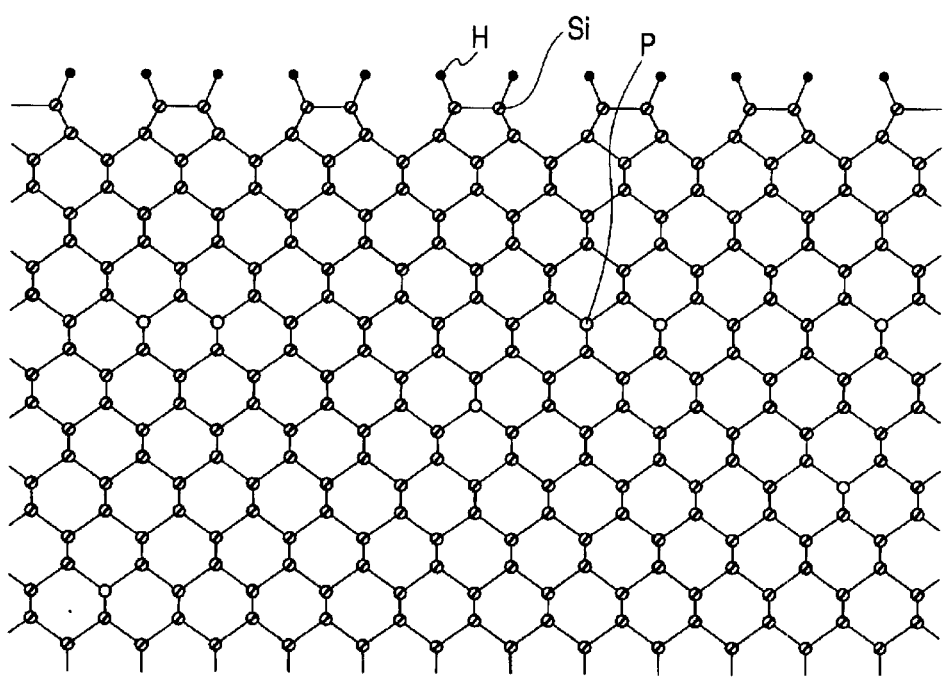
FIG. 4 is a schematic diagram showing how atoms are arranged after silicon atoms have been deposited on the hydrogen-terminated (100) surface of the silicon substrate shown in FIG. 3 for crystal growth at a low temperature.

FIG. 4 is a schematic diagram showing how atoms are arranged after silicon atoms have been deposited on the hydrogen-terminated (100) surface of the silicon substrate shown in FIG. 3 for crystal growth at a low temperature. Growth of eight silicon crystal layers from the segregation layer of phosphorus atoms is shown. If phosphorus atoms are not active enough as donors due to the formation of pairs, they will be activated by annealing at a low temperature which permits them to diffuse over a distance equivalent to several atoms.

DESCRIPTION OF THE PREFERRED EMBODIMENTS

Now, the present invention will be described in more detail with reference to the following examples.

EXAMPLE 1

This example demonstrates, with reference to FIGS. 5A to 5E, production of a p-channel MOSFET (PMOS) which has an n-type delta doping layer buried therein as the punch-through stopper.

Figure 5A:
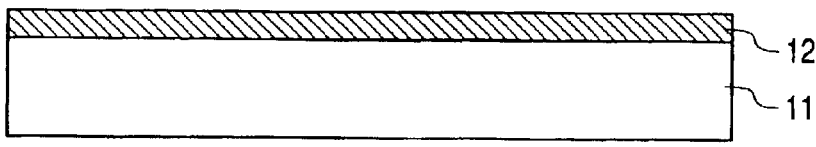
FIGS. 5A to 5E are schematic diagrams showing the steps of producing a p-channel MOSFET (PMOS) which has an n-type delta doping layer buried therein as the punch-through stopper.

The production process starts with introduction of phosphorus atoms by ion implantation into the (100) surface of the silicon substrate. This step forms an n-type doping region 12 (about 0.3 μm thick) in which the concentration is about $10^{17}/cm^3$. FIG. 5A shows a schematic cross sectional view of the resulting substrate.

Figure 5B:
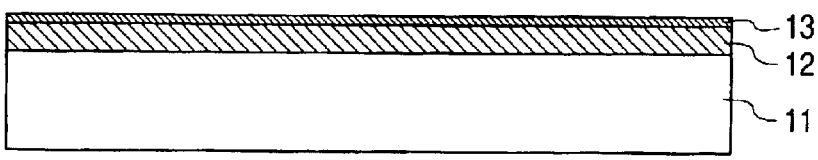
Figure 5C:
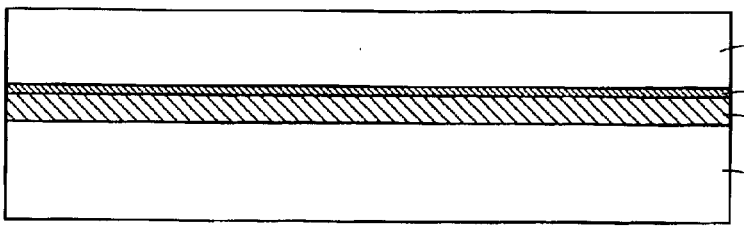

In the second step, hydrogen termination is performed on the surface of the doped substrate 11, so that phosphorus atoms segregate to the surface. This segregation forms under the top hydrogen atomic layer an n-type delta doping layer 13 with a thickness of one atomic layer in which the concentration is about $10^{18}/cm^3$. FIG. 5B shows a schematic sectional view of the resulting substrate.

Hydrogen termination is accomplished by placing the silicon substrate 11 in a heat chamber (not shown) for a prescribed period of time, said chamber having a tungsten filament electrically heated at about 1500° C. and containing hydrogen gas at a pressure of about $4\times10^{-6}$ Pa. Hydrogen molecules undergo thermal decomposition by the tungsten filament, as described in J. Vac. Sci. Technol. 14 (1997), p. 397. Usually, the tungsten filament is surrounded by an insulating material with high melting point in the form of thin long cylinder with an opening at one end, and the cylinder is positioned such that its open end faces the surface of the silicon substrate. In this way the silicon surface is exposed to atomic hydrogen efficiently. The duration of exposure to atomic hydrogen is about 10 minutes; it varies depending on the number of atomic hydrogen atoms generated in a unit time which is determined by the hydrogen gas pressure and the tungsten filament temperature. A desirable condition is such as to supply enough atomic hydrogen to hydrogenate atoms (about $6.78\times10^{14}/cm^2$) on the (100) silicon surface. The silicon substrate is kept at about 300–400° C. during this hydrogen termination process.

The third step is intended to bury the n-type delta doping layer 13 (formed in the preceding steps) in silicon crystals. This is accomplished by causing silicon atoms to be adsorbed to the surface for crystal growth, with the substrate 11 (having the delta doping layer formed on the surface thereof) kept at about 200° C. so that the hydrogen-terminated structure is retained.

On the hydrogen-terminated silicon surface, the adsorbed silicon atoms deposit under hydrogen atoms and they do not readily grow into islands. Consequently, silicon crystals grow at about 200° C., which is lower than the temperature (about 800° C.) at which silicon crystals grow from silicon atoms adsorbed to the clean surface of silicon. In this method, the temperature of the silicon substrate can be selected in the range from 30° C. to 300° C. The temperature of the silicon substrate can be raised to 450° C. if hydrogen atom is being supplied to keep the hydrogen-terminated structure stable. Crystal growth needs about 5 minutes to about 1 hour, depending on the temperature of the silicon substrate. The higher the temperature, the shorter the crystal growth time.

Figure 5D:
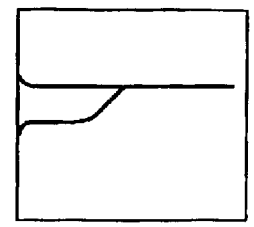

Phosphorus atoms in the silicon substrate vary in concentration depending on the depth as shown in FIG. 5D. Their distribution is characterized by a sharp peak in the n-type delta doping layer 13 (one atomic layer) and very low concentrations in the upper layer. Thus, the foregoing steps yield a silicon substrate for PMOS with a delta doping layer buried therein which functions as the punch-through stopper.

Figure 5E:
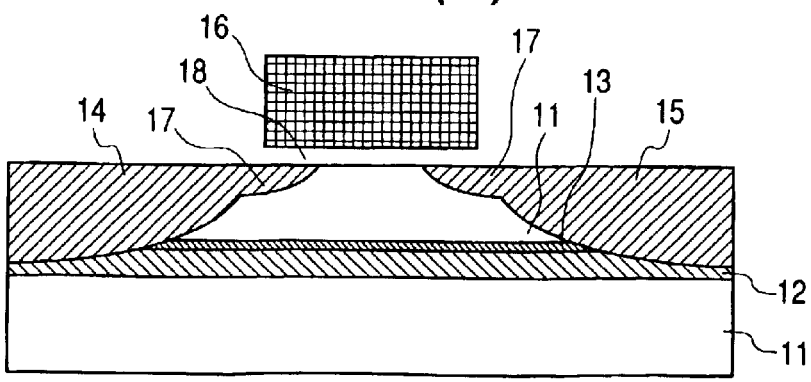

Subsequently, the silicon substrate with a buried n-type delta doping layer is coated with a gate insulating film 18 of prescribed thickness in a usual way. A gate electrode 16 is formed on the gate insulating film 18 in a usual way. A p-type source 14, a drain 15, and an extension 17 are formed by using this gate electrode 16 as a mask in a usual way. Thus there is obtained a PMOS having an n-type delta doping layer as a punch-through stopper. FIG. 5E shows the resulting PMOS in enlarged schematic cross section. This PMOS is characterized in that the silicon layer forming the channel can be made to be free of impurity, and hence it has lower resistance and hence better electrical properties than conventional ones.

Incidentally, although the n-type delta doping layer 13 is extremely thin (one atomic layer), it is shown in FIG. 5 as if it had a certain thickness. This practice is repeated in the following examples.

EXAMPLE 2

This example demonstrates, with reference to FIGS. 6A to 6D, production of a PMOS in which the n-type delta doping layer functions as the punch-through stopper and the p-type delta doping layers functions as the extensions of the source and the drain.

Figure 6A:
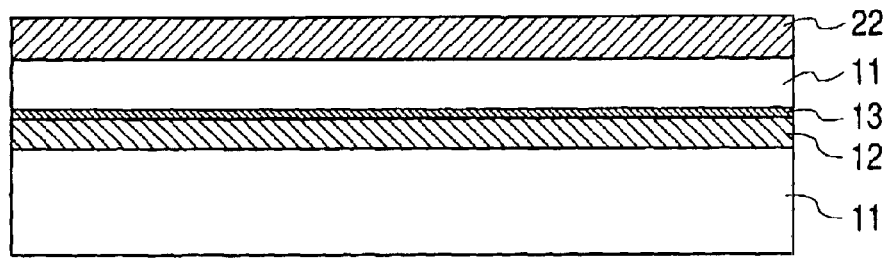
FIGS. 6A to 6D are schematic diagrams showing the steps of producing a p-channel MOSFET (PMOS) which has an n-type delta doping layer as the punch-through stopper, and p-type delta doping layers as the respective extensions of the source and the drain.

In the first step shown in FIG. 6A, the substrate prepared in the third step (FIG. 5C) of Example 1 is doped with boron atoms by ion implantation into its surface. This ion implantation forms a p-type doped region 22 (about 0.3 μm thick) with a concentration of about $10^{17}/cm^3$.

Figure 6B:
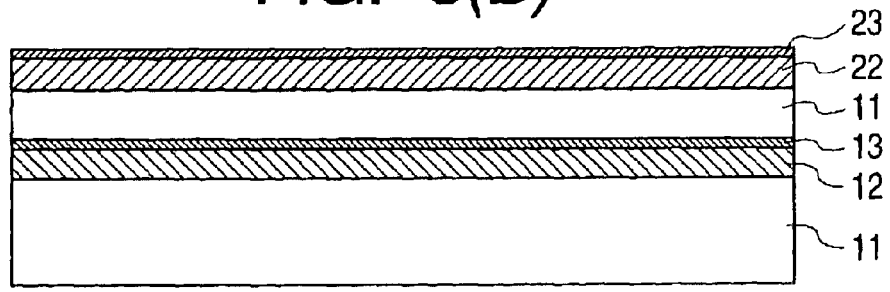

In the second step shown in FIG. 6B, the surface of the substrate undergoes hydrogen termination in the same way as mentioned in Example 1. This hydrogen termination causes boron atoms to segregate in the surface, so that a p-type delta doping layer 23 is formed under the surface hydrogen atomic layer. The p-type delta doping layer 23 has a thickness of one atomic layer and a concentration of about $10^{18}/cm^3$.

Figure 6C:
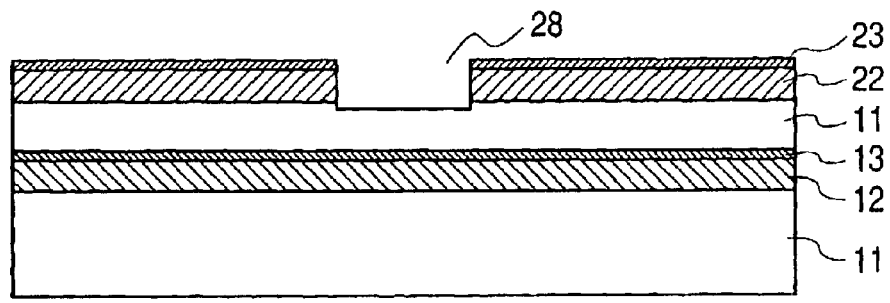

In the third step shown in FIG. 6C, the surface of the substrate undergoes conventional etching to remove a part (28) of the p-type delta doping layer 23.

Figure 6D:
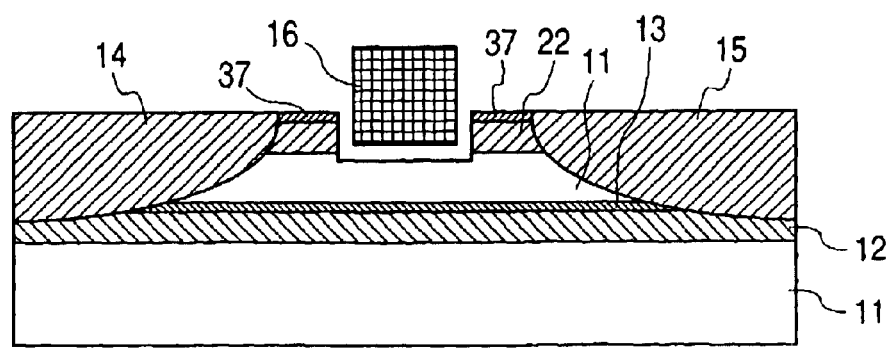

In the fourth step shown in FIG. 6D, a gate electrode 16 is formed in the removed part 28 of the delta doping layer 23 by the conventional method. Subsequently, boron atoms are implanted in the usual way into the locations corresponding to the source 14 and the drain 15, respectively. The p-type delta doping layer 23 remaining intact functions as the respective extensions of the source 14 and the drain 15.

EXAMPLE 3

This example demonstrates, with reference to FIGS. 7A to 7D, production of a CMOS which is a combination of a PMOS and an NMOS, the former having an n-type delta doping layer as the punch-through stopper and the latter having a p-type delta doping layer as the punch-through stopper.

Figure 7A:
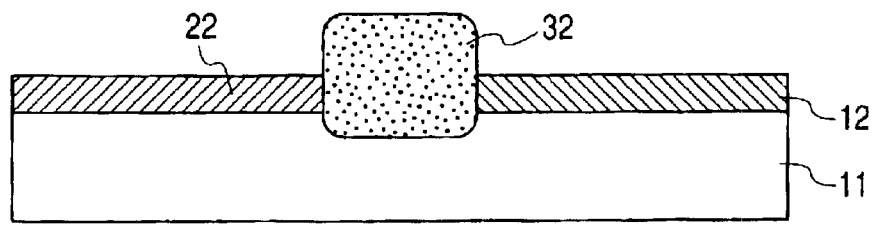
FIGS. 7A to 7D are schematic diagrams showing the steps of producing a CMOS which is a combination of a PMOS and an NMOS, the former having an n-type delta doping layer as the punch-through stopper and the latter having a p-type delta doping layer as the punch-through stopper.

In the first step shown in FIG. 7A, an oxide film 32 for element separation is formed in the silicon substrate 11 in the usual way. The clean surface of silicon is exposed. Phosphorus atoms are implanted into the surface at the right side of the oxide film 32. This implantation forms an n-type doped region 12 which is about 0.3 μm thick and has a concentration of about $10^{17}/cm^3$. Then, boron atoms are implanted into the surface at the left side of the oxide film 32. This implantation forms a p-type doped region 22 which is about 0.3 μm thick and has a concentration of about $10^{17}/cm^3$. FIGS. 7A to 7D show only one each of adjacent PMOS and NMOS for simplicity. In an actual semiconductor device, however, these elements are repeated to form an array consisting of a large number of CMOSs.

Figure 7B:
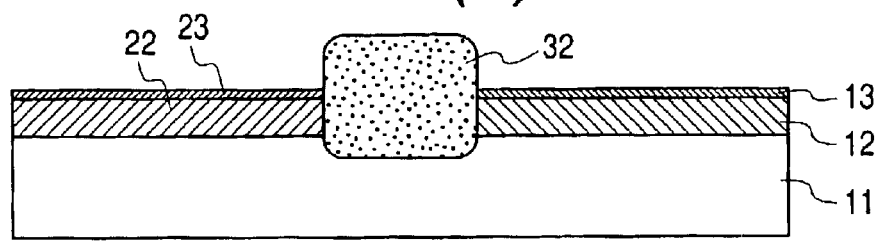

In the second step shown in FIG. 7B, the surface of the substrate undergoes hydrogen termination in the same way as mentioned in Example 1. This hydrogen termination causes phosphorus atoms to segregate to the surface from the n-type doped region 12, so that an n-type delta doping layer 13 is formed under the surface hydrogen atomic layer. The n-type delta doping layer 13 has a thickness of one atomic layer and a concentration of about $10^{18}/cm^3$. At the same time, this hydrogen termination causes boron atoms to segregate to the surface from the p-type doped region 22, so that a p-type delta doping layer 23 is formed under the surface hydrogen atomic layer. The p-type delta doping layer 23 has a thickness of one atomic layer and a concentration of about $10^{18}/cm^3$.

Figure 7C:
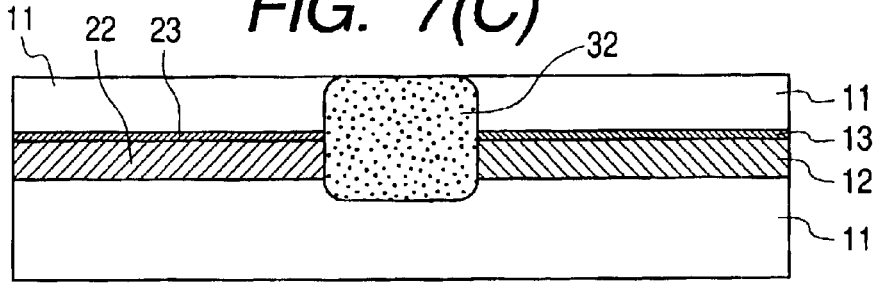

In the third step shown in FIG. 7C, silicon crystals are grown by adsorption of silicon atoms on the n-type delta doping layer 13 and the p-type delta doping layer 23, in the same way as explained in Example 1 (FIG. 5C), with hydrogen termination remaining intact. Thus there is obtained the semiconductor substrate having an n-type delta doping layer 13 and a p-type delta doping layer 23 both buried in silicon crystals.

Figure 7D:
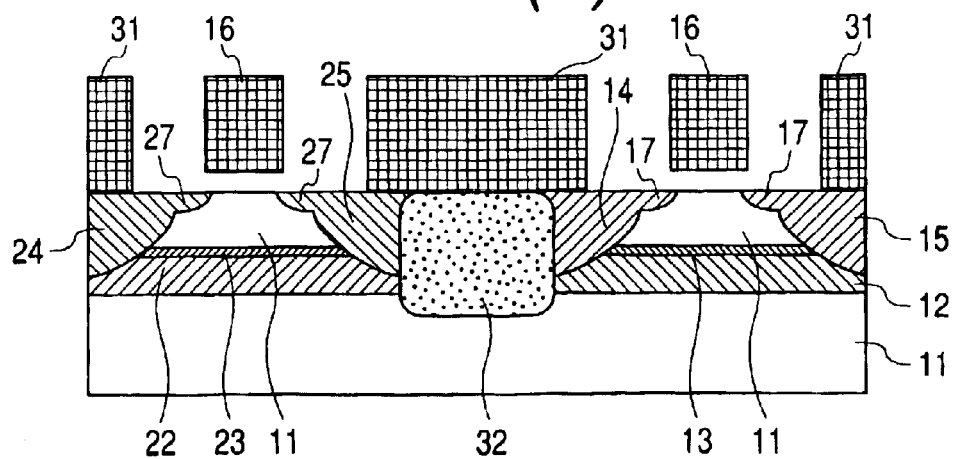

In the fourth step shown in FIG. 7D, wiring 31 to connect the gate electrode 16 and the MOS is formed. In the right half region with an n-delta doping layer buried therein, a p-type source 14, a drain 15, and an extension 17 are formed. In the left half region with a p-delta doping layer buried therein, an n-type source 24, a drain 25, and an extension 27 are formed. Thus there is obtained the desired CMOS consisting of a PMOS and an NMOS, the former having an n-type delta doping layer as the punch-through stopper and the latter having a p-type delta doping layer as the punch-through stopper.

EXAMPLE 4

Figure 8A:
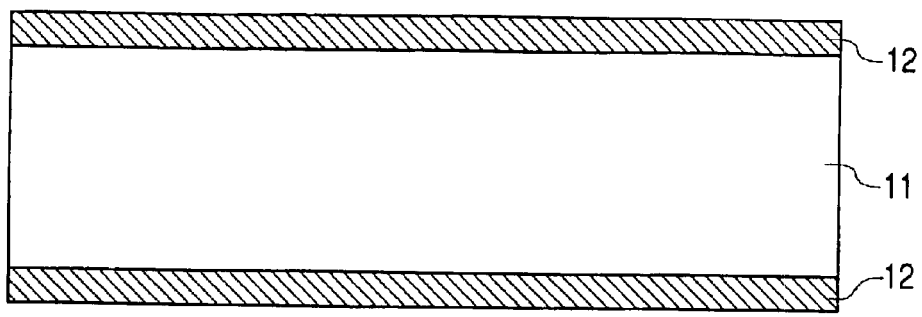
FIGS. 8A to C are schematic diagrams showing the steps of producing a semiconductor substrate having PMOSs formed on both sides thereof, each PMOS having an n-type delta doping layer as the punch-through stopper.
Figure 8B:
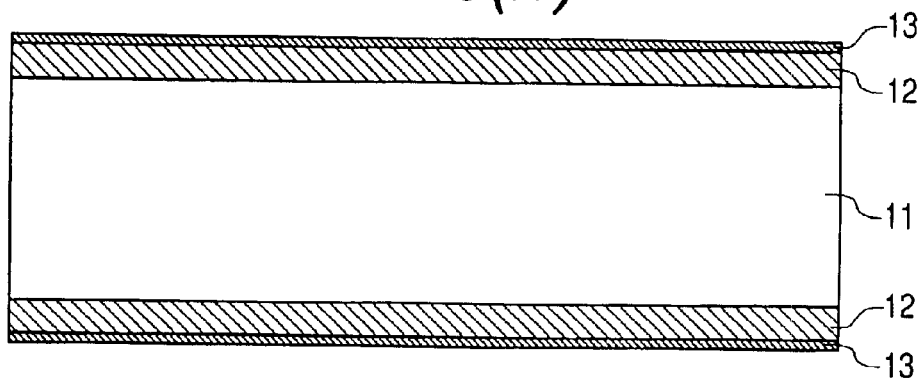
Figure 8C:
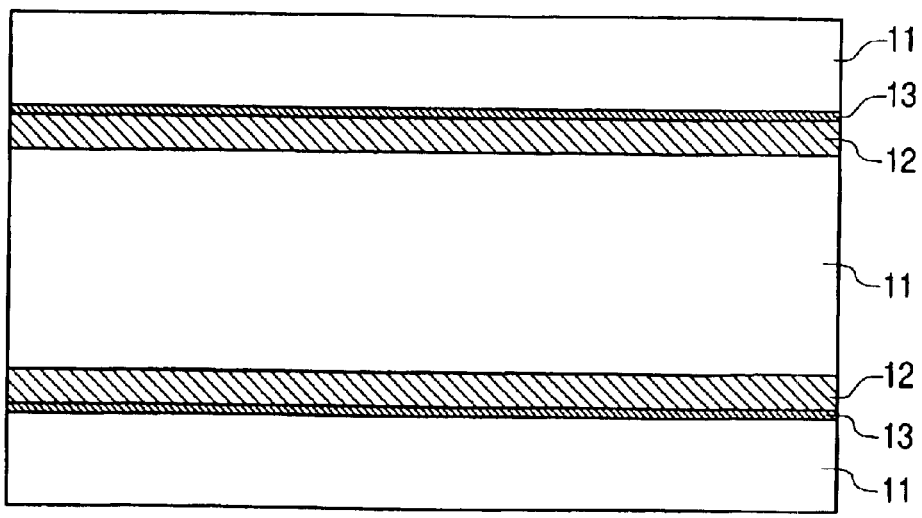

This example demonstrates, with reference to FIGS. 8A to 8C and FIG. 9, production of a semiconductor substrate having PMOSs on both sides thereof, each PMOS having an n-type delta doping layer as the punch-through stopper. The PMOSs are formed in the same way as explained in Example 1. FIGS. 8A to 8C correspond to FIGS. 5A to 5C, and FIG. 9 corresponds to FIG. 5E.

In the first step shown in FIG. 8A, the silicon substrate 11 is doped with phosphorus atoms by ion implantation into both sides thereof. This ion implantation forms an n-type doped region 12 (about 0.3 $\mu$m thick) with a concentration of about $10^{17}/cm^3$ on both sides.

In the second step shown in FIG. 8B, the both surfaces of the substrate undergo hydrogen termination in the same way as mentioned in Example 1. This hydrogen termination causes phosphorus atoms to segregate to the surface, so that an n-type delta doping layer 13 is formed under the surface hydrogen atomic layer. The n-type delta doping layer 13 has a thickness of one atomic layer and a concentration of about $10^{18}/cm^3$.

In the third step shown in FIG. 8C, silicon crystals are grown by adsorption of silicon atoms on the n-type delta doping layer 13. Thus there is obtained the semiconductor substrate having an n-type delta doping layer 13 buried in silicon crystals. This step is carried out in the same way as in Example 1. That is, silicon atoms are adsorbed for crystal growth while the substrate is heated at about 200° C. and the hydrogen termination is kept intact.

Figure 9:
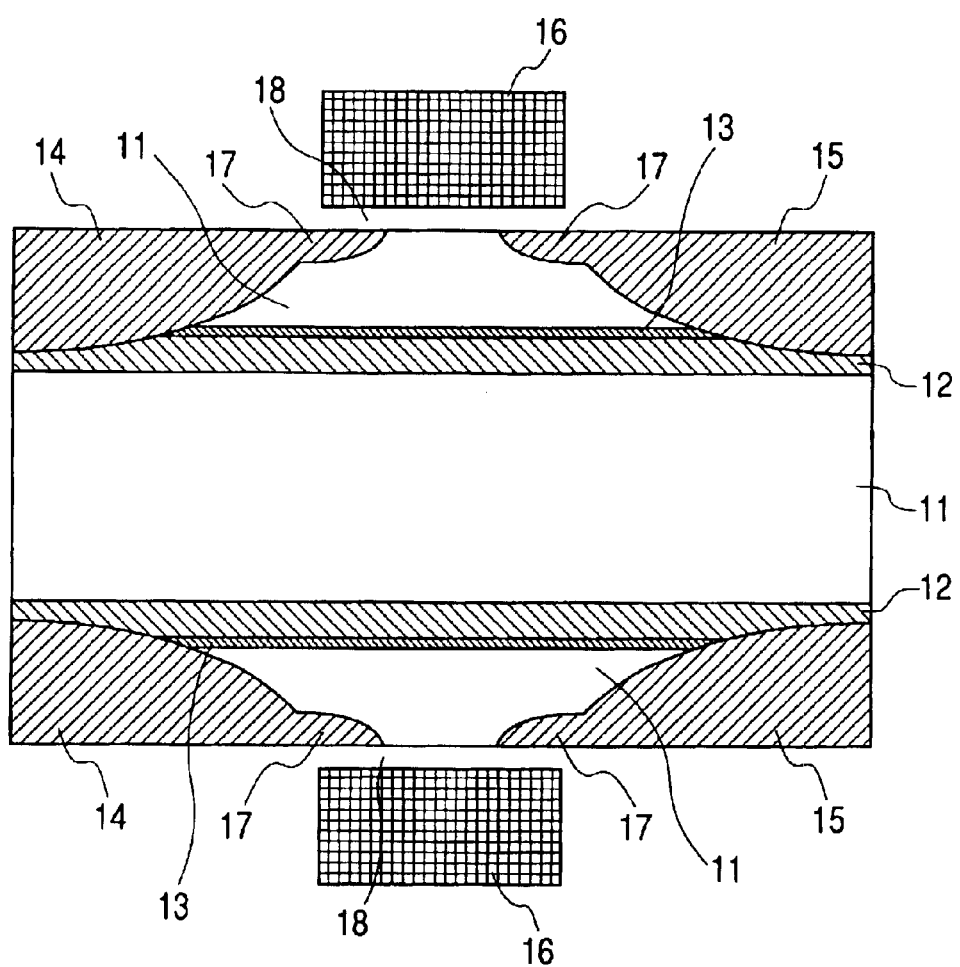
FIG. 9 is a schematic diagram showing the step (succeeding the last step shown in FIG. 8) of producing a semiconductor substrate having PMOSs on both sides thereof, each PMOS having an n-type delta doping layer as the punch-through stopper.

In the fourth step shown in FIG. 9, a gate insulating film 18 of prescribed thickness and a gate electrode 16 are formed in the usual way. A p-type source 14, a drain 15, and an extension 17 are formed by using this gate electrode 16 as a mask. Thus there is obtained a semiconductor having PMOSs on both sides thereof, each PMOS having an n-type delta doping layer 13 as the punch-through stopper. This structure doubles the degree of integration of PMOSs.

EXAMPLE 5

This example demonstrates, with reference to FIGS. 10 to 15, production of a PMOS having a p-type source and drain formed in the usual way and an n-type delta doping layer 13 (as the punch-through stopper) formed subsequently.

Figure 10:
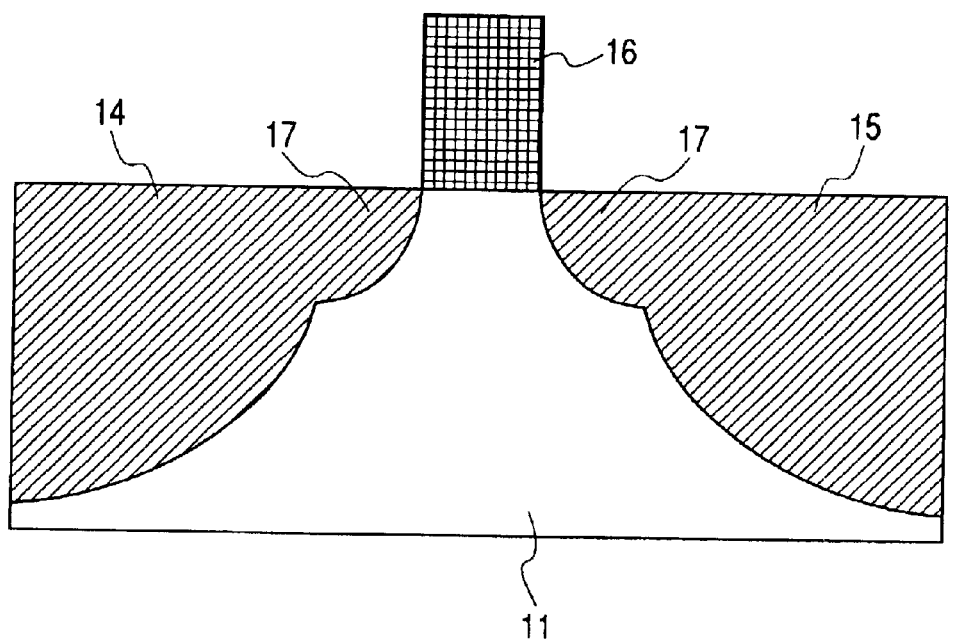
FIG. 10 is a schematic enlarged sectional view showing a semiconductor device having a p-type source, drain, extension, and gate electrode formed on the surface of a silicon substrate by conventional method.

In the first step shown in FIG. 10, the surface of the silicon substrate 11 is fabricated in the usual way to form a p-type source 14, a drain 15, an extension 17, and a gate electrode 16.

Figure 11:
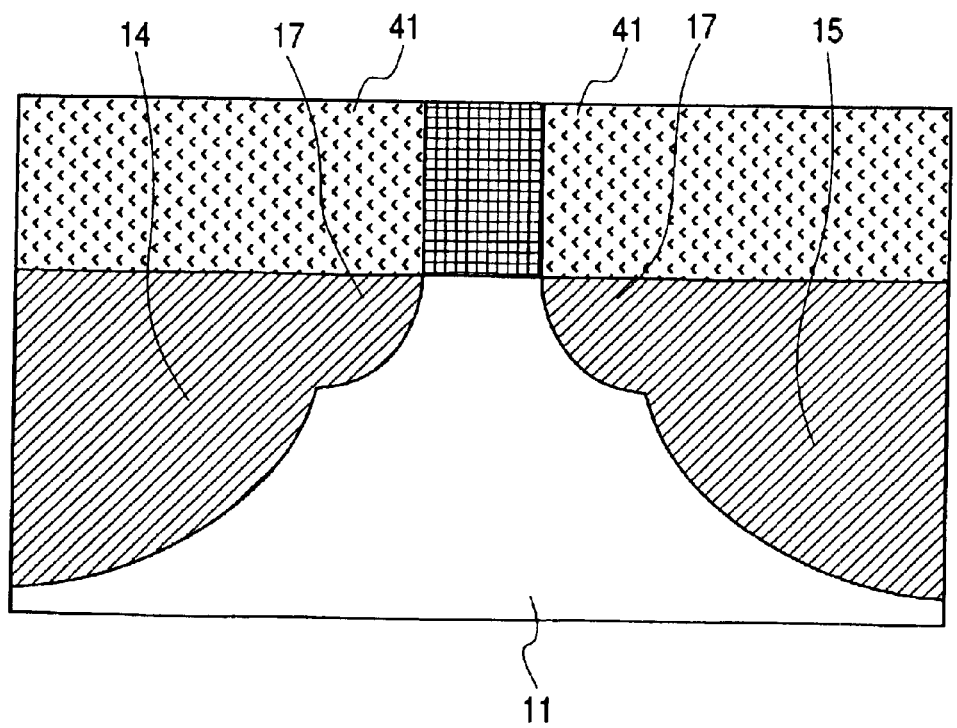
FIG. 11 is a schematic sectional view showing the substrate coated in the usual way with a silicon oxide film 41 as an etching mask, said silicon oxide film being planarized so that the gate electrode 16 is exposed.

In the second step shown in FIG. 11, the surface of the substrate is coated in the usual way with a silicon oxide film 41 as an etching mask. The silicon oxide film is planarized so that the gate electrode 16 is exposed.

Figure 12:
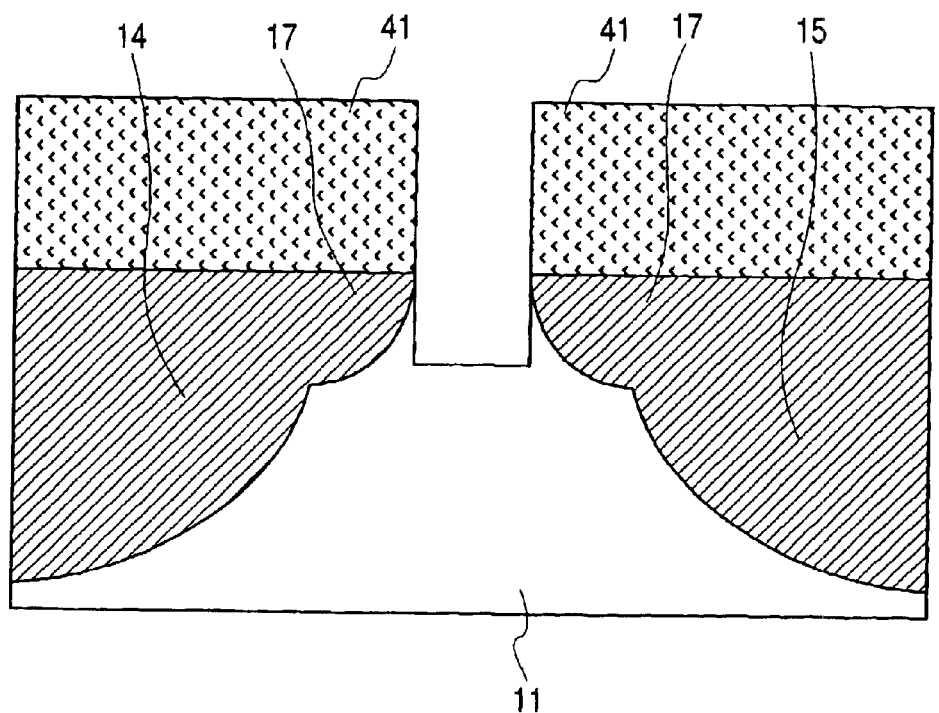
FIG. 12 is a schematic sectional view showing the substrate in which the gate electrode is removed by etching and the resulting groove is made as deep as the source, the drain, and the extension.

In the third step shown in FIG. 12, the gate electrode 16 is removed from the substrate by etching. The resulting hole in the silicon substrate 11 is made as deep as the source 14, the drain 15, and the extension 17.

Figure 13:
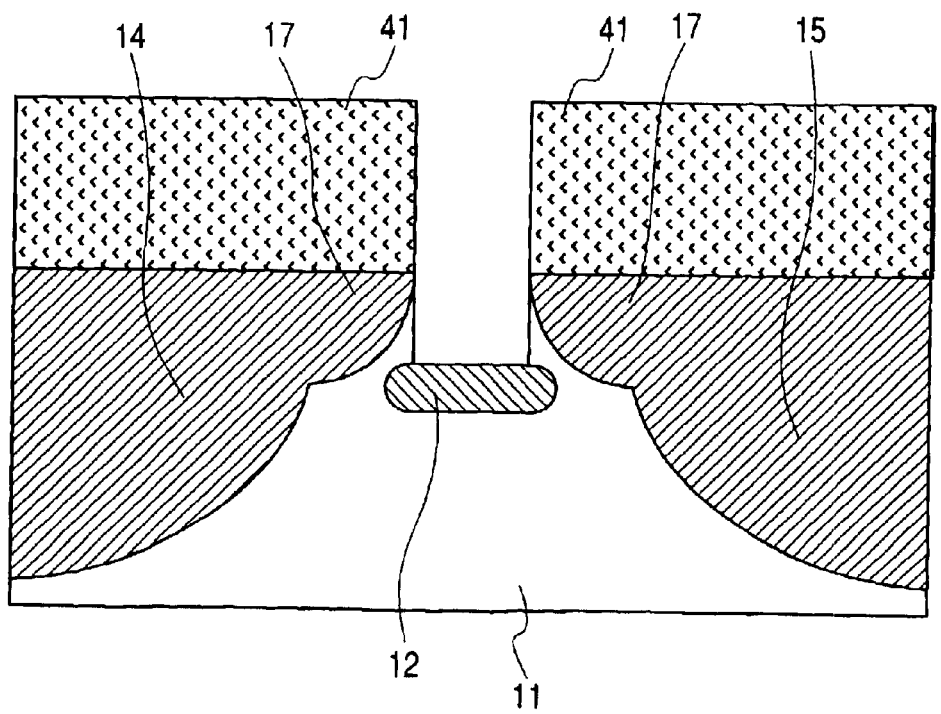
FIG. 13 is a schematic sectional view showing the substrate in which the groove has an n-type doped region 12 formed on its bottom by ion implantation of phosphorus atoms. The region 12 is between the two extensions and is slightly deeper than them.

In the fourth step shown in FIG. 13, phosphorus atoms are implanted into the bottom of the hole in the substrate 11. This ion implantation forms an n-type doped region 12 which is about 0.3 $\mu$m thick and has a concentration of about $10^{17}/cm^3$. The region 12 is between the two extensions 17 and is slightly deeper than them. Since the surface is coated with a masking oxide film 41, there is no possibility that phosphorus atoms enter the source 14 and the drain 15, except for the bottom of the groove. If the angle of ion implantation is inclined from the vertical, it is possible to extend the doped region 12 in the horizontal direction.

Figure 14:
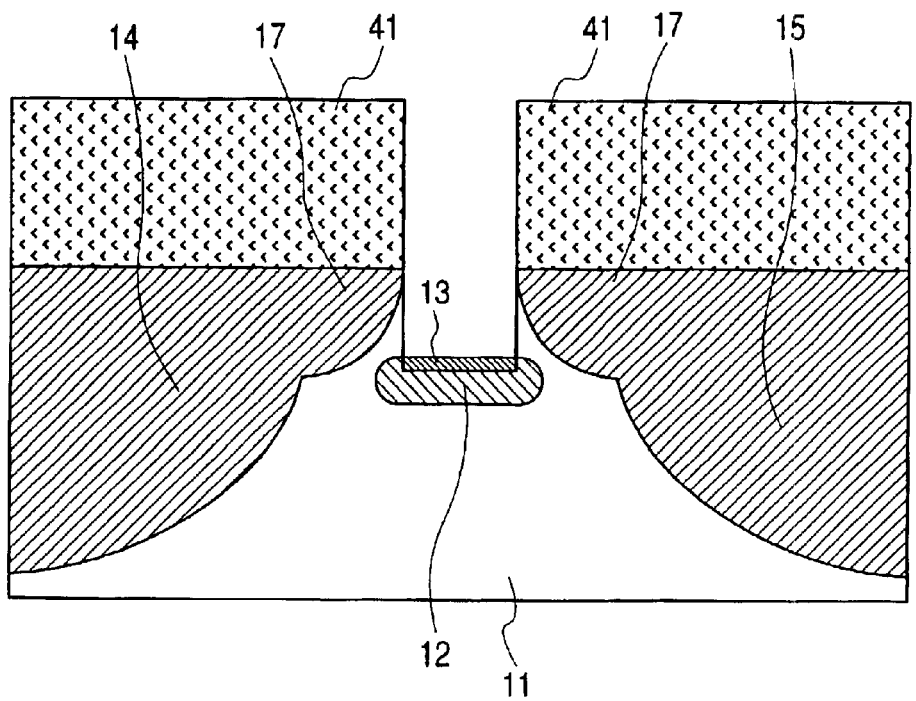
FIG. 14 is a schematic sectional view showing the substrate which has undergone hydrogen termination so that phosphorus atoms segregate from the n-type doped region 12 to the inner surface of the groove. This segregation forms an n-type delta doping layer under the surface hydrogen atomic layer.

In the fifth step shown in FIG. 14, the substrate undergoes hydrogen termination in the same way as in Example 1, so that phosphorus atoms segregate from the n-type doped region 12 to the inner surface of the groove. This segregation forms, under the surface hydrogen atomic layer, an n-type delta doping layer 13 which has a thickness of about one atomic layer and has a concentration of about $10^{18}/cm^3$. The thus formed n-type delta doping layer 13 functions as the punch-through stopper in the same way as that in the PMOS explained with reference to FIG. 5.

Figure 15:
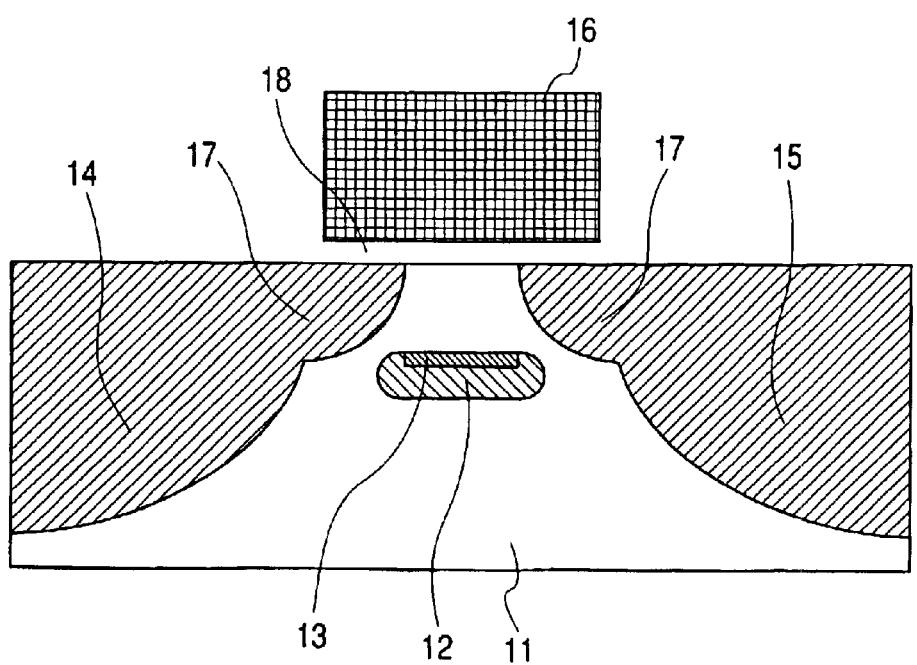
FIG. 15 is a schematic sectional view showing the PMOS having the groove filled with lightly doped silicon crystals and an insulating layer and a gate electrode formed thereon.

In the sixth step shown in FIG. 15, the groove in the substrate is filled with lightly doped silicon crystals, and an insulating layer and a gate electrode 16 are formed thereon. Thus there is obtained a semiconductor of PMOS structure. This step is carried out as follows. First, silicon crystals are grown to fill the groove by adsorption of silicon atoms, with the substrate kept at about 200° C. and the hydrogen-terminated structure kept intact. Then, the gate electrode 16 is formed, with an insulating film interposed thereunder. Finally, the oxide film 41 as a mask is removed. The thus obtained PMOS has the n-type delta doping layer 13 as the punch-through stopper. This PMOS has lower resistance and better electrical properties than the conventional ones. The advantage of this example is that it is easy to control temperature for adequate distribution of phosphorus atoms in the delta doping layer, because the delta doping layer is formed after the source and drain have been formed.

Options

The above-mentioned examples are designed to form the n-type delta doping layer from phosphorus atoms and the p-type delta doping layer from boron atoms. However, phosphorus atoms may be replaced by atoms of Group V and boron atoms may be replaced by atoms of Group III. No mention is made in the foregoing of the removal of residual hydrogen atoms after hydrogen termination because residual hydrogen atoms do not hinder the function of MOS. However, an additional step for this purpose may be included as a matter of course. Incidentally, in Example 5, hydrogen atoms for hydrogen termination are adsorbed to the surface of the oxide film 41 as a mask; residual hydrogen atoms in this case are removed as the oxide film 41 is removed.

The method according to the present invention is simpler and more economical than the conventional process which consists of depositing dopant atoms (to form one atomic layer) directly by molecular beam epitaxy.

The foregoing invention has been described in terms of preferred embodiments. However, those skilled, in the art will recognize that many variations of such embodiments exist. Such variations are intended to be within the scope of the present invention and the appended claims.

What is claimed is:

1. A method for producing a semiconductor device which comprises causing dopant atoms already present in a semiconductor substrate to migrate to the surface of said semiconductor substrate, thereby forming a thin layer of segregated dopant atoms in which the which the dopant atom concentration is higher than that of said substrate.

2. A method for producing a semiconductor device as defined in claim 1, wherein the dopant atoms are caused to migrate randomly to the surface of said semiconductor substrate.

3. A method for producing a semiconductor device which comprises:

a step of doping a substrate with first impurity atoms, a step of causing atoms different from those of the first impurity atoms to be adsorbed to the surface of said substrate, thereby causing the doped first impurity atoms to migrate to the surface and form a thin layer in which the doped first impurity atoms are segregated and their concentration is higher than that in the substrate, a step of burying in the substrate the thin layer of doped first impurity atoms formed by migration in the preceding step, and a step of forming a region containing a second impurity whose dopant type is opposite to that of the first impurity.

4. A method for producing a semiconductor device as defined in claim 3, wherein the thin layer of doped first impurity atoms formed by the migration has a thickness of one atomic layer to 20 atomic layers.

5. A method for producing a semiconductor device as defined in claim 3, wherein the atoms different from those of the first impurity are hydrogen atoms.

6. A method for producing a semiconductor device as defined in claim 3, wherein the causing the doped first impurity atoms to migrate is carried out in such a way that hydrogen atoms are adsorbed to the surface of the substrate to form a layer whose surface density is larger than a half monolayer and smaller than two monolayers.

7. A method for producing a semiconductor device as defined in claim 3, wherein the step of burying the thin layer of doped first impurity atoms in the semiconductor substrate is accomplished by depositing the same atoms as the substrate while keeping the substrate temperature at 30–400° C. and keeping said hydrogen atoms on the surface.

8. A method for producing a semiconductor device as defined in claim 3, wherein the doped first impurity atoms are caused to migrate randomly to said surface.

9. A method for producing a semiconductor device as defined in claim 3, wherein said thin layer forms a delta doping layer of the semiconductor device.

10. A method for producing a semiconductor device which comprises a step of doping the surface of a semiconductor substrate entirely or partly with an impurity, a step of forming an impurity thin layer, a step of burying said impurity thin layer in the semiconductor substrate, a step of doping said semiconductor substrate with another impurity whose dopant type is opposite to that of said impurity, a step of forming an opposite type dopant layer of said impurity having the opposite dopant type, a step of cutting into separate two regions by etching said opposite type dopant layer, a step of forming an insulating layer, and a step of forming a gate electrode, and a step of forming source and drain electrodes.

* * * * *